United States Patent [19]

Hubbell et al.

[11] 4,103,339

[45] Jul. 25, 1978

[54] ACOUSTIC SURFACE WAVE BUBBLE SWITCH

[75] Inventors: Wayne C. Hubbell, Richardson; Christopher T. Chang, Dallas, both of Tex.

[73] Assignee: The United States of America as represented by the Secretary of the Air Force, Washington, D.C.

[21] Appl. No.: 679,268

[22] Filed: Apr. 22, 1976

[51] Int. Cl.² ............................................. G11C 19/08
[52] U.S. Cl. ............................................ 365/1; 365/16
[58] Field of Search ................ 340/174 CR, 174 AC, 340/174 YC, 174 MS, 173 MS; 365/1, 16, 157

[56] References Cited

U.S. PATENT DOCUMENTS

| | | | |
|---|---|---|---|
| 3,320,596 | 5/1967 | Smith, Jr. et al. | 340/173 MS |
| 3,743,851 | 7/1973 | Kohara | 340/174 IC |
| 3,836,897 | 9/1974 | Marsh | 340/174 MS |

OTHER PUBLICATIONS

"Bubble Domain Logic Devices" by Lin – IBM Tech. Dis. Bul., vol. 13, #10, 3/71.
Bubble Lattice File Using Double-Layer Structures–by Lin et al., IBM Tech. Dis. Bul., vol. 17, #8, 1/75.

Primary Examiner—Vincent P. Canney
Attorney, Agent, or Firm—Joseph E. Rusz; Julian L. Siegel

[57] ABSTRACT

An acoustic surface wave bubble switch in which a magnetic bubble domain traveling in a thin film magnetic platelet can be guided in alternate directions by application of an acoustic wave. An array of longitudinal magnetic elements in the form of single bars and bars combined to form a T configuration together with a rotating in-plane magnetic field causes the magnetic bubble to propagate across the magnetic platelet. One of the configurations of the magnetic element is a T with a second horizontal bar and the bubble will have equal attraction for either of the horizontal bars. At the proper time an acoustic wave can direct the bubble to propagate in the direction of a chosen horizontal bar thereby effecting a switching action.

5 Claims, 5 Drawing Figures

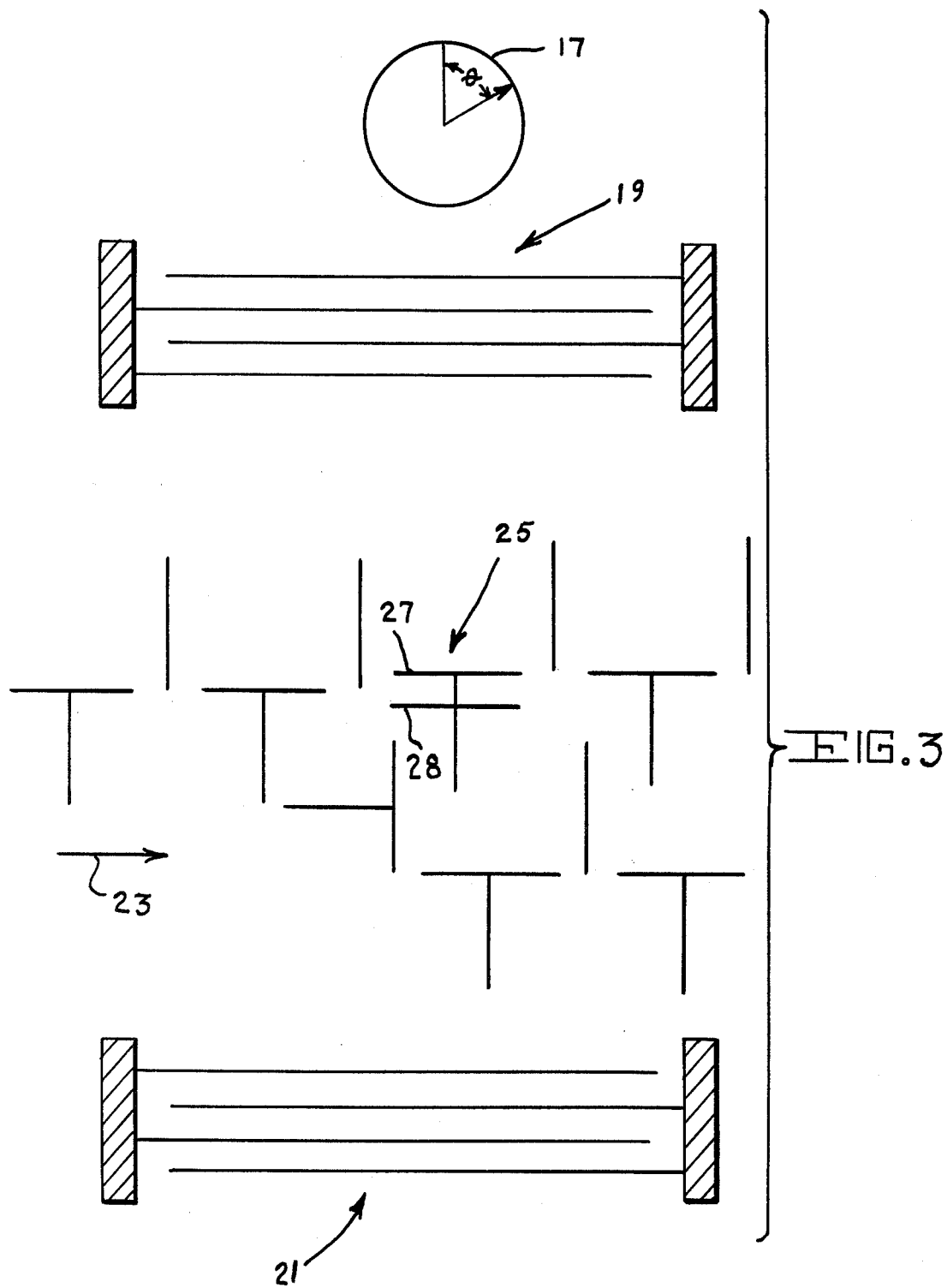

ACOUSTIC SURFACE WAVE BUBBLE SWITCH

STATEMENT OF GOVERNMENT INTEREST

The invention described herein may be manufactured and used by or for the Government for governmental purposes without the payment of any royalty thereon.

BACKGROUND OF THE INVENTION

This invention relates to switching circuits, and more particularly to an acoustic surface wave magnetic domain bubble switch.

Prior to the present invention, magnetic bubble domains where the bubbles represent binary data, have been used for storing computer data while the logic of the computer has been performed in devices external to the magnetic bubble domain memory. With the present invention, memory bubble domain techniques are utilized to perform logic functions. Thus, with the present invention, logic and storage functions can be combined in one magnetic bubble domain device thereby eliminating substantially the requirement for external logic devices.

In a previously filed application entitled, "Surface Wave Augmented Memory System", application Ser. No. 631,278, filed Nov. 12, 1975, there is shown and described a system for controlling the propagation of a magnetic bubble using an acoustic surface wave and in-plane magnetic field. The present invention uses the acoustic wave and a magnetic field to provide a novel binary switch.

SUMMARY OF THE INVENTION

The present invention is a switching system using magnetic bubble propagation together with an acoustic surface wave to bias the flow of magnetic bubbles in order to favor one of two equally likely paths depending upon the direction of the acoustic wave. The switching system can be used for a binary logic circuit. The propagation results from a pattern of magnetic bars and an in-plane rotating magnetic field. The pattern of bars consists of single vertical bars and combinations of a vertical bar and a horizontal bar forming a T configuration. One of the T's has a second horizontal bar and these two bars represent the alternate paths for the bubble. The chosen path is determined by the direction of the acoustic wave.

It is therefore an object of this invention to provide a magnetic bubble domain.

It is another object to provide a method and system of switching streams of magnetic bubble domains.

It is still another object to provide a magnetic domain bubble switch using acoustic surface waves.

These and other objects, features and advantages of the invention will become more apparent from the following description when taken in conjunction with the illustrative embodiment in the accompanying drawings, where like reference characters refer to like elements in the several views.

DESCRIPTION OF THE DRAWINGS

FIG. 3 shows the T bar bubble circuit used in the invention; and

DETAILED DESCRIPTION OF THE PREFERRED EMBODIMENT

Figure 1:
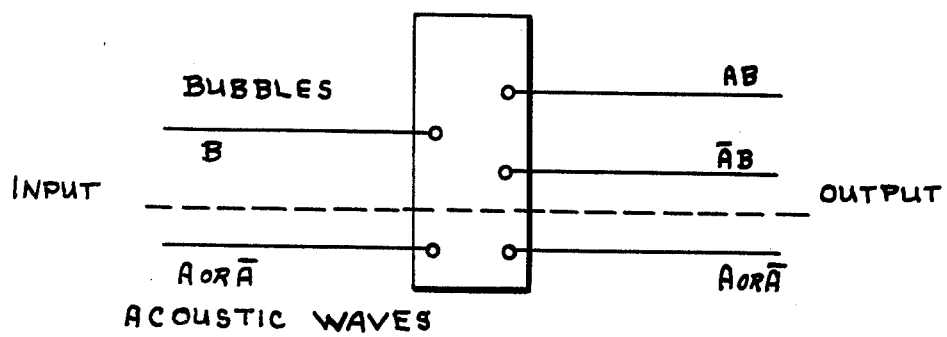
FIG. 1 is a symbolic diagram showing the use for a magnetic bubble transfer function in a logic element.

The present invention is a switching system that provides a technique of performing certain magnetic bubble memory functions including the transfer function. The switch can be used as a logic element as shown in FIG. 1. Above the dotted line, the inputs and outputs are bubbles. Below the dotted line, the inputs and outputs are acoustic waves. By controlling the direction of an acoustic wave represented by A or $\bar{A}$, the direction of a bubble represented by B can be controlled and the output would be either $\bar{A}B$ or AB. The path of the bubble would determine which output line would be effected.

Figure 2:
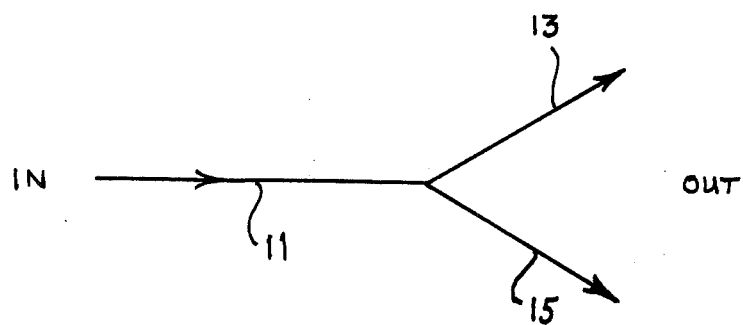
FIG. 2 is a basic schematic diagram for switching that can be implemented using magnetic domain bubbles.

The invention presents a switching device that determines which of two alternate paths a magnetic domain bubble or a stream of bubbles will follow, as shown in FIG. 2. The principle of the bubble switching system is the use of acoustic surface waves to bias the bubbles to favor one of two equally likely patterns. A bubble on path 11 can be directed to either path 13 or 15.

The bubble paths are magnetic bars such as Permalloy guiding elements which utilize a rotating in-plane magnetic field to supply the basic drive force. The Permalloy elements are arranged in such a way that a bubble which is at a certain point in the circuit finds itself equally attracted to two elements immediately ahead of it. The two elements are each members of distinct paths which branch off at that point. The spacing of the elements is such that at the junction the bubble has equal likelihood of pursuing both paths. However, if an acoustic wave traveling in the proper direction simultaneously intersects the junction, then the bubble's path is accordingly biased in the favor of one of the two possible paths. On the other hand, a surface wave traveling in the reverse direction would cause the bubble to take the opposite path.

The acoustic wave exerts a force on the bubble in the direction of propagation of the wave (transverse to the flow of bubbles in the circuit) and upsets the metastable balance of the two forces which attract the bubble to the two forward elements. The main drive force for propagation is still the in-plane magnetic field via the Permalloy elements. The acoustic wave, however, produces a perturbation which determines which attraction predominates.

An embodiment of the invention using an array of Permalloy elements in a T bar bubble circuit is shown schematically in FIG. 3. The general motion of the bubble as indicated by arrow 23 is from left to right as the in-plane magnetic field 17 rotates clockwise. The acoustic surface wave transducers are represented symbolically by the upper and lower interdigital electrode arrays 19 and 21. Peizoelectric layers can be interposed between the interdigital electrodes. Transducers 19 and 21 can launch waves which travel perpendicular to the general direction of the bubble flow. The switching action occurs at the element array 25 which consists of a vertical bar and two horizontal bars 27 and 28. When the field rotation is such that the left ends of the horizontal bars 27 and 28 of this element attract a bubble which is located immediately to its left, the direction of propagation of the surface acoustic wave determines to which of these two bars the bubble will finally propagate. If the bubble moves to the top horizontal bar 27, then the rotating in-plane field will cause it to propagate along the upper path of the entire array. The reverse is true for the lower bar 28.

Figure 4A:
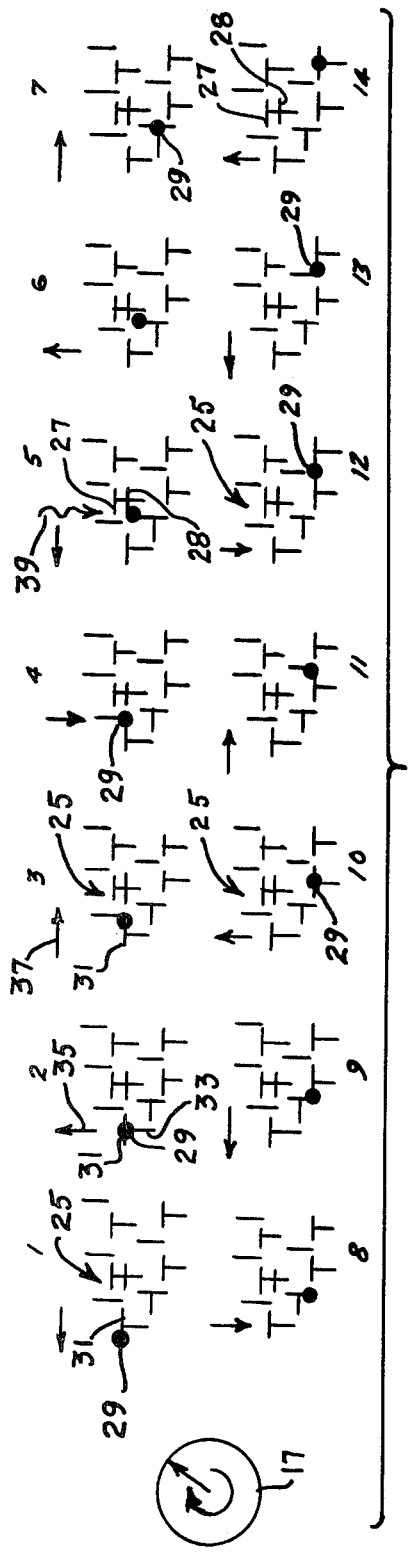
FIGS. 4a and 4b are a series of schematic diagrams showing the operation of the T-bar bubble circuit in a switching function.
Figure 4B:
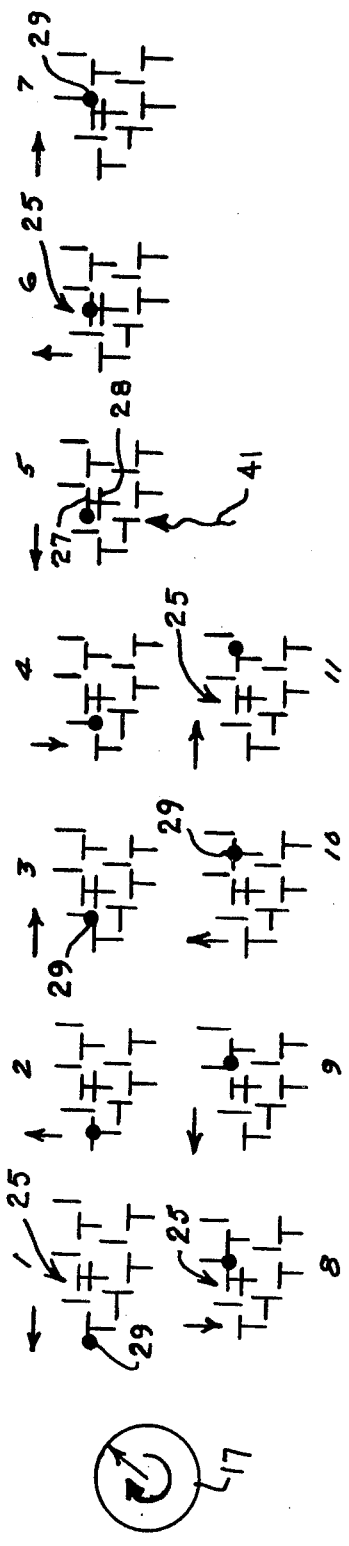

The above sequence is illustrated in FIGS. 4a and 4b. FIG. 4a shows bubble 29 switched to the lower path of the array while FIG. 4b shows the bubble 29 switched to the upper path. In examining position 2 of FIG. 4a, bubble 29 has moved to the right of horizontal bar 31 from that shown in position 1. This occurred because vertical bar 33 was acted upon by rotating magnetic field 17, which at position 2 is directed upward as shown by arrow 35 and converts the top of vertical bar 33 into a north pole. Bubble 29 is the equivalent of a south pole and hence would be attracted to the temporary north pole on vertical bar 33. In position 3, magnetic field 17 has rotated 90° as shown by arrow 37 which converts the right side of horizontal bar 31 to a north pole and forces bubble 29 to the right. The process continues to propagate bubble 29 to the right in the remaining positions of FIG. 4a and, of course, applies to all of the positions of FIG. 4b. However, at position 5 of FIGS. 4a and 4b, bubble 29 has equal likelihood to be effected by either horizontal bar 27 or horizontal bar 28 of element group 25. At this point in FIG. 4a acoustic surface wave 39 applies a downward bias to bubble 39 and the remaining positions show that bubble 29 has taken the lower path driven by rotating magnetic field 17 applied to the magnetic elements. In FIG. 4b, at position 5, acoustic surface wave 41 is in the upward direction and consequently the subsequent positions show that bubble 29 will transverse the upward path. The acoustic waves can be operated in either a continuous wave or a pulsed mode with wavelength $y = 4d$ where $d$ is the bubble diameter.

What is claimed is:

1. A system for switching the direction of movement of magnetic bubble domains in a sheet of material in which magnetic bubble domains can propagate, comprising:
   a. a rotating in-plane magnetic field;
   b. an array of magnetic overlay elements in said magnetic field for guiding the bubble domains, said array of magnetic overlay elements including a switching element positioned to present alternative paths for the bubble, said array of magnetic overlay elements forming a pattern of magnetic bars comprising respectively a single verticl bar in combination with a vertical bar and a horizontal bar in combination to form a T configuration, and
   c. a pair of acoustic surface wave transducers for generating acoustic surface waves perpendicular to the switching element whereby acoustic surface waves control selection of the paths of the bubble domains, said acoustic surface wave and said magnetic field cooperating to provide a binary switch, said binary switch controlling said array of magnetic overlay elements.

2. A system for switching the direction of movement of magnetic bubble domains according to claim 1 wherein the acoustic surface wave generating means comprise a pair of interdigital arrays of electrodes with piezoelectric layers interposed between the electrodes and with the interdigital array being positioned on opposite sides of the array of magnetic elements.

3. A system of switching the direction of movement of magnetic bubble domains according to claim 2 wherein the magnetic overlay elements are Permalloy.

4. A system of switching the direction of magnetic domain bubbles according to claim 3 wherein the acoustic waves are continuous waves.

5. A system of switching the direction of magnetic domain bubbles according to claim 3 wherein the acoustic waves are pulsed.

* * * * *